United States Patent
Skoog et al.

(10) Patent No.: US 9,633,567 B1
(45) Date of Patent: Apr. 25, 2017

(54) GROUND COLLISION AVOIDANCE SYSTEM (IGCAS)

(71) Applicant: The United States of America as Represented by the Administrator of NASA, Washington, DC (US)

(72) Inventors: Mark A Skoog, Palmdale, CA (US); Kevin Prosser, Palmdale, CA (US); Loyd Hook, Tulsa, OK (US)

(73) Assignee: The United States of America as Represented by the Administrator of the National Aeronautics and Space Administration, Washington, DC (US)

( * ) Notice: Subject to any disclaimer, the term of this patent is extended or adjusted under 35 U.S.C. 154(b) by 350 days.

(21) Appl. No.: 14/560,068

(22) Filed: Dec. 4, 2014

(51) Int. Cl.
G08G 5/04 (2006.01)
G08G 5/00 (2006.01)
B64D 45/04 (2006.01)
G06F 17/50 (2006.01)
G08G 5/06 (2006.01)

(52) U.S. Cl.
CPC ............ *G08G 5/045* (2013.01); *B64D 45/04* (2013.01); *G06F 17/5009* (2013.01); *G08G 5/0039* (2013.01); *G08G 5/04* (2013.01); *G08G 5/06* (2013.01)

(58) Field of Classification Search
CPC .................................. G08G 5/04; G08G 5/06
USPC ....... 701/301, 9; 340/961, 970, 974; 342/29, 342/455
See application file for complete search history.

(56) References Cited

U.S. PATENT DOCUMENTS

| 5,839,080 A | * | 11/1998 | Muller | G05D 1/0676 340/970 |
| 6,088,654 A | * | 7/2000 | Lepere | G01C 5/005 342/29 |
| 6,829,459 B2 | | 12/2004 | Conner et al. | |
| 7,205,906 B2 | | 4/2007 | Johnson et al. | |
| 7,236,104 B2 | | 6/2007 | Tran | |
| 7,257,487 B2 | | 8/2007 | Tran | |
| 7,337,043 B2 | | 2/2008 | Bull | |
| 7,693,618 B2 | | 4/2010 | Johnson et al. | |

(Continued)

*Primary Examiner* — Thomas G Black
*Assistant Examiner* — Wae Louie
(74) *Attorney, Agent, or Firm* — Mark Homer (57) ABSTRACT

The present invention is a system and method for aircraft ground collision avoidance (iGCAS) comprising a modular array of software, including a sense own state module configured to gather data to compute trajectory, a sense terrain module including a digital terrain map (DTM) and map manger routine to store and retrieve terrain elevations, a predict collision threat module configured to generate an elevation profile corresponding to the terrain under the trajectory computed by said sense own state module, a predict avoidance trajectory module configured to simulate avoidance maneuvers ahead of the aircraft, a determine need to avoid module configured to determine which avoidance maneuver should be used, when it should be initiated, and when it should be terminated, a notify Module configured to display each maneuver's viability to the pilot by a colored GUI, a pilot controls module configured to turn the system on and off, and an avoid module configured to define how an aircraft will perform avoidance maneuvers through 3-dimensional space.

18 Claims, 7 Drawing Sheets

(56) References Cited

U.S. PATENT DOCUMENTS

| | | | |
|---|---|---|---|
| 7,881,866 B2 | 2/2011 | Meunier et al. | |
| 8,010,288 B2 * | 8/2011 | Bouchet | G08G 5/0086 340/961 |
| 8,049,644 B1 | 11/2011 | Oehlert et al. | |
| 8,249,799 B2 | 8/2012 | Flotte et al. | |
| 8,280,622 B2 * | 10/2012 | Meunier | G01C 5/005 340/945 |
| 8,395,533 B2 | 3/2013 | Ganille et al. | |
| 2005/0004723 A1 * | 1/2005 | Duggan | G05D 1/0061 701/24 |
| 2007/0050101 A1 * | 3/2007 | Sacle | B64D 45/0015 701/11 |
| 2009/0105890 A1 * | 4/2009 | Jones | G01C 23/00 701/1 |
| 2009/0174591 A1 * | 7/2009 | Cornic | G01S 13/44 342/29 |
| 2013/0191016 A1 * | 7/2013 | Baillon | B64D 45/04 701/301 |
| 2014/0142838 A1 * | 5/2014 | Durand | G05D 1/0083 701/301 |
| 2015/0142214 A1 * | 5/2015 | Cox et al. | G05D 1/0083 701/3 |

* cited by examiner

GROUND COLLISION AVOIDANCE SYSTEM (IGCAS)

BACKGROUND a. Field of Invention

The invention relates to guidance systems and methods and, more particularly, to an improved ground collision avoidance system (iGCAS) inclusive of a hardware architecture and software in which a robust array of collision avoidance processes are functionally partitioned into separate software modules. Collectively, the iGCAS modules autonomously determine when a ground collision is imminent, what maneuver should be used to avoid the predicted ground collision, and when the maneuver should be initiated and terminated. The avoidance maneuver may be executed automatically by an autopilot system or signaled to the pilot for manual execution.

b. Background of the Invention

Controlled Flight into Terrain (CFIT) occurs when properly functioning aircraft under the control of qualified crew are inadvertently flown into terrain. CFIT is a leading cause of aviation fatalities for non-commercial air-carriers, causing an estimated 100 fatalities per year in the U.S. The problem was conformed by several studies in the 1970s and since then the U.S. National Transportation Safety Board (NTSB) has mandated some form of ground proximity warning system (GPWS) on larger aircraft. Smaller turboprop airplanes were thought less susceptible to such accidents, but subsequent studies found that many small aircraft accidents could have been similarly avoided with GPWS equipment. Early GPWS used the downward looking radio altimeter to determine height above ground and rate of closure to determine if an aircraft was in a potentially hazardous situation. Subsequent improvements incorporated limited situational awareness (e.g. landing gear deployment) and ILS glideslope deviation warnings.

More recent advances in terrain mapping technology have led to the development in the late 1990s of an enhanced ground proximity Warning System (EGPWS) that combines accurate positional knowledge (normally determined from GPS) with a three dimensional map of surrounding terrain to identify ground-flight path conflict ahead of the aircraft and generate audio and visual warnings to the flight crew when certain parameters are breached. The FAA refers to EGPWS systems as Terrain Awareness and Warning Systems (TAWS), while others still use the more generic term "GPWS". TAWS improves on the earlier GPWS systems by providing the flight crew much earlier aural and visual warning of impending terrain, forward looking capability, and continued operation in the landing configuration. Currently, all U.S. registered turbine-powered airplanes with six or more passenger seats (exclusive of pilot and copilot seating) must be equipped with an FAA-approved TAWS system.

Parallel to commercial aviation, the U.S. Defense Department developed TAWS functionality for military implementation. Early DoD systems focused on altitude clearance and used radar and barometric altimeters to give clearance plane and descent after takeoff warnings. Next generation systems incorporated navigation information from radar, radio navigation, GPS and inertial navigation systems to determine the three dimensional position relative to the earth based on digital terrain elevation databases to create a predictive warning system. The Navy provided TAWS capability in the F/A-18 aircraft in 2004, and the Air Force separately developed and deployed its Predictive Ground Collision Avoidance System (PGCAS) in the F-16. PGCAS functions by establishing the aircraft's position relative to the surrounding terrain as mapped in the Digital Terrain System (DTS). DTS scans a corridor and develops a "worst case" two dimensional terrain-obstacle profile from the data in the corridor and PGCAS provides pilot advisories for terrain located within at least 10 seconds time of flight from the aircraft. The PGCAS algorithm provides inputs to the F-16 core avionics computers which generates HUD, MFDS, and VMU advisories to the pilot when the aircraft trajectory penetrates the pilot-selectable Minimum Terrain Clearance (MTC) setting, obstacles included By way of example, U.S. Pat. No. 5,839,080 to Muller et al. (assigned to Allied Signal) discloses a terrain awareness system (TAS) that provides LOOKAHEAD/LOOK-DOWN as well as LOOK-UP terrain advisory and warning indications to the pilot of an aircraft of a hazardous flight condition. This system employs an airport data base, GPS, and a terrain data base having various resolutions depending on the topography of the particular geographic area of interest, and provides terrain advisory and the warning signals as a function of the flight path of the aircraft.

U.S. Pat. No. 6,826,459 to Conner et al. (assigned to Honeywell) discloses a ground proximity warning system, method and computer program product that controllably alter the base width of the alert envelope in order to accommodate uncertainties associated with the current position of the aircraft.

U.S. Pat. No. 7,205,906 to Johnson et al. (assigned to Honeywell) discloses a system, method and computer program product for reducing nuisance warnings during low altitude flight conditions and in the presence of low position uncertainty. The system includes a first component that determines whether the aircraft is in a low altitude flight condition and a second component that determines the position, positional uncertainty, and the heading. The system also includes a third component that attenuates and refines the look-ahead envelope in accord with the determined condition of flight and positional uncertainty.

U.S. Pat. Nos. 7,236,104 and 7,257,487 to Tran (assigned to Honeywell) disclose a hybrid air collision avoidance system (HACAS), an air collision avoidance system with extended existing air avoidance capabilities and incorporated with new hybrid capabilities to perform hybrid air collision prediction and hybrid air collision avoidance.

U.S. Pat. No. 7,337,043 to Bull (assigned to Rockwell Collins) discloses a terrain advisory system for an aircraft. The TAWS generates cautions and alerts. The processing unit includes a program that generates a terrain advisory envelope extending beyond the distance and lateral envelope within which the TAWS provides cautions and alerts.

U.S. Pat. No. 7,693,618 to Johnson et al. (assigned to Honeywell) discloses a system and method for monitoring Required Navigational Performance (RNP) Procedures and reducing nuisance Enhanced Ground Proximity Warning System warnings.

U.S. Pat. No. 7,881,866 to Meunier et al. (assigned to Thales) discloses a Terrain Awareness and Warning System that produces a new "Too Low Terrain" predictive alert of "Caution" type when the crew of the aircraft has the possibility of resolving a detected risk of collision with the terrain without interrupting the current maneuver to stabilize at a safety altitude by a leveling-off maneuver, without performing a vertical avoidance maneuver.

U.S. Pat. No. 8,049,644 to Oehlert et al. (assigned to Rockwell Collins) discloses a terrain advisory system configured to generate a three-dimensional image.

U.S. Pat. No. 8,249,799 to Flotte et al. (assigned to Thales) discloses a method of presenting zones at risk for an aircraft.

U.S. Pat. No. 8,280,622 to Meunier et al. (Assigned to Thales) discloses a system indicating to a pilot that an aircraft has passed the limit-point of success of a standard vertical avoidance maneuver.

U.S. Pat. No. 8,395,533 to Ganille et al. (assigned to Thales) discloses a method for managing an anticollision system for aircraft comprising means of detecting collision with a threat and at least one head-up viewing device. The symbol system comprises two display modes dedicated to collision detection which are: on the one hand an "action" mode—a potential collision is detected by the system, the symbol system comprises at least one symbol representative of the limits of the disengagement path of the aircraft to avoid the collision and enabling the pilot to engage his avoidance maneuver, and on the other hand a "control" mode—this mode is displayed when the avoidance maneuver is engaged and the collision avoided.

United States Patent Application 20130191016 by Baillon et al. (Thales Neuilly-sur-Seine) published Jul. 25, 2013 shows a Method and Device for the Filtering of Alerts Originating from a Collision Detection System of an Aircraft during runway approach. Apparently, current onboard terrain detection systems are disabled as soon as the aircraft is situated in the environs of an airport, and cannot warn of abnormal drops in the case of a CFIT (controlled flight into terrain). The '1016 application analyzes angle of descent for the landing runway, altitude of the aircraft, distance to the runway, and speed vector, and authorizes the output of a terrain warning alert in an abnormal drop situation even though all landing envelope conditions (horizontal and vertical convergence) are met.

All the foregoing TAWS improvements provide more time for flight crew to take corrective action, but still suffer from several shortcomings. TAWS only alerts the unaware pilot to a problem but fails to advise the pilot on how to get out of the problem. Moreover, TAWS systems are highly susceptible to providing too many false warnings. This tends to lull pilots into ignoring valid warnings when they come, or even worse, turn the system off.

With this as a baseline, the system disclosed herein proposes several improvements over currently implemented commercial (Class A) and general aviation (Class B) terrain awareness and warning systems (TAWS), including an improved collision avoidance algorithm fidelity, throughput enhancements including trajectory modeling and terrain handling, and display enhancements for presenting multi-trajectory escape options. The multiple improvements not only avoid false warnings and provide more time for flight crew to take corrective action, but also advise the pilot on how to get out of a problem. In contrast to the prior art, this tends to encourage pilots to pay attention to all warnings when they come and never turn the system off.

SUMMARY OF THE INVENTION

It is, therefore, an object of the present invention to avoid false warnings while providing sufficient time for flight crew to take corrective action, and to provide realtime direction to the pilot or autopilot on the correct evasive maneuver to perform. The present invention accomplishes this with a system and method for aircraft ground collision avoidance (iGCAS) comprising a modular array of software, including a sense own state module configured to gather and condition the data needed to compute a trajectory, a predict avoidance trajectory module configured to simulate avoidance maneuvers ahead of the aircraft, a sense terrain module including a digital terrain map (DTM) and map manger routine to store and retrieve terrain elevations, a predict collision threat module configured to generate an elevation profile corresponding to the terrain under the trajectory computed by said predict avoidance trajectory module, a determine need to avoid module configured to determine which avoidance maneuver should be used, when it should be initiated, and when it should be terminated, a notify module configured to display each maneuver's viability to the pilot by a colored GUI, a pilot controls module configured to turn the system on and off, and an avoid module configured to define how an aircraft will perform avoidance maneuvers through 3-dimensional space.

BRIEF DESCRIPTION OF THE DRAWINGS

Additional aspects of the present invention will become evident upon reviewing the embodiments described in the specification and the claims taken in conjunction with the accompanying figures, wherein like numerals designate like elements, and wherein:

DETAILED DESCRIPTION OF THE PREFERRED EMBODIMENTS

The present invention is an improved ground collision avoidance system (iGCAS) inclusive of a hardware architecture and software in which each collision avoidance function is functionally partitioned into a separate software module. The iGCAS autonomously determines when a collision is imminent, what avoidance maneuver should be used, and when it should be initiated and terminated. Each collision avoidance function is contained in a separate software module, including: "Sense Own State'" "Sense Terrain"; and "Pilot Controls" all providing inputs to a Predict Collision Threat algorithm and a Predict Avoidance Trajectories (collision avoidance) algorithm, which in turn feed a Determine Need to Avoid algorithm that determines which avoidance maneuver should be used and when it should be initiated and terminated. This can be implemented automatically by an Avoid algorithm or to provide a Notify function for Pilot Control.

Figure 1:
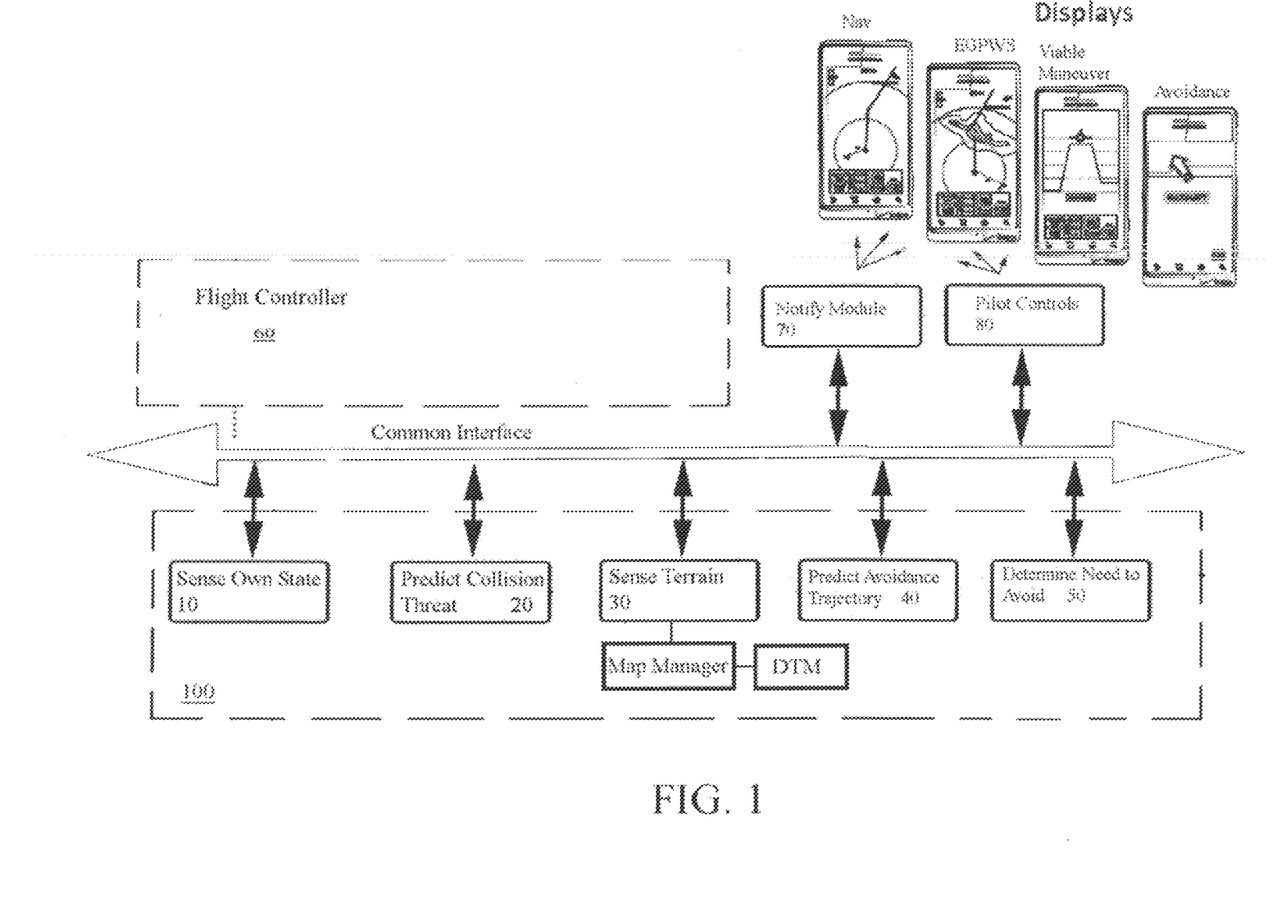
FIG. 1 is a block diagram of the overall system architecture.

FIG. 1 is a block diagram of the overall system architecture, which comprises a modular array of software for data exchange with other modules, remote devices and user displays, as well as the existing flight controller 60. The open architecture modularity allows adding, upgrading and swapping of both hardware and software components. All of the software modules are run on an iGCAS controller 100 which may be a conventional avionics device with glass cockpit display or a conventional PC-based computer such as a laptop, with on-board display and network interface, including cockpit laptop, tablet computer or other personal computing device (PDA). The controller 100 is in network connection via a common communication interface that facilitates the data exchange using industry standard protocols such as the Transmission Control Protocol/Internet Protocol ("TCP/IP"), File Transfer Protocol (FTP), HTTPS, DiCOM, wireless, etc. The system software modules comprise the following:

1. Sense Own State Module 10. The Sense Own State Module 10 functions to gather sufficient data to compute trajectory and support the Predict Avoidance Trajectory Module 40. The Sense Own State Module 10 interrogates the flight controller 60 for its primary inputs. For general aviation fixed-wing aircraft this includes such parameters as geo-referenced position (latitude, longitude and altitude), aircraft rates (climb rate and roll rate), velocity vector information (ground track and true airspeed), bank angle, other parameters affecting the performance of the aircraft (indicated airspeed and density altitude) and horizontal winds. Starting aircraft gross weight is entered by the operator or fed through a third party weight and balance routine. The Sense Own State Module 10 may synthesize or estimate certain parameters that are not available as follows: (1) true airspeed may be estimated from inertial velocities, which can be derived from geo-referenced position, by removing wind speed; (2) indicated airspeed can be estimated from true airspeed through the use of standard atmospheric tables in combination with density altitude; (3) density altitude can be derived from pressure altitude and temperature, or pressure altitude can be substituted for density altitude; (4) if true or indicated airspeed is available, winds can be estimated by comparing to inertial velocities derived from geo-referenced position; (5) climb rate can be derived from inertial velocities which in turn may be derived from geo-referenced position; (6) bank can be estimated through integration of angular rates if rate gyros are available in the controller 100; (7) alternatively, bank can be estimated by using the geo-referenced position to derive a turn rate and using standard flight mechanics models to derive the required bank to generate that turn rate; (8) alternatively, bank can be derived using a magnitometer (if available) to derive turn rate and similarly the required bank via a rate of change analysis; and (9) vertical winds (i.e. downdraft) can be estimated from horizontal winds and the topography of the local terrain, which is available from the DTM (Lee-Side Wind Modeling). Alternatively, if inputs for certain parameters such as bank and roll rate are not available, these parameters may be set to "zero" or to a minimal value such as 20 degrees. In addition, where inputs for bank are not available, the arrow in the avoidance director display (described in more detail below) may not be displayed.

For rotorcraft, additional parameters additional inputs to the Sense Own State Module 10 may include the status of cabin heat and anti-icing systems, which may be used to estimate the available thrust that the engine can deliver. For high performance jet aircraft, additional inputs to the Sense Own State Module 10 may include normal load factor and any additional pilot settings that can affect the aircraft's maneuvering ability (such as changes in angle-of-attack and roll rate limits).

Finally, the Sense Own State module collects, when available, or computes when not available, data on the uncertainties associated with the above mentioned parameters. For example, horizontal and vertical position accuracy is often estimated by navigation systems throughout the flight. Another example is that DTM elevation accuracy often varies with geographic location, and many DTM products record this local accuracy in the product itself. The uncertainties that are collected by the Sense Own State module are passed along with the associated state data to the downstream modules so that those modules can account for measurement uncertainties in the collision avoidance estimate.

The Sense Own State Module 10 employs a "Trajectory Prediction Algorithm" (TPA) which takes the foregoing inputs and predicts the three dimensional trajectory profile of the aircraft using known laws of physics. The Sense Own State Module 10 is also capable of submitting hypothetical inputs to the TPA to compute potential alternate trajectory profiles for the aircraft. As described in further detail below, the Predict Avoidance Trajectory Module 40 is supported by the Sense Own State Module 10. The Predict Avoidance Trajectory Module 40 simulates avoidance maneuvers ahead of the aircraft by drawing on outputs from the Sense Own State Module 10 and the TPA.

Figure 2:
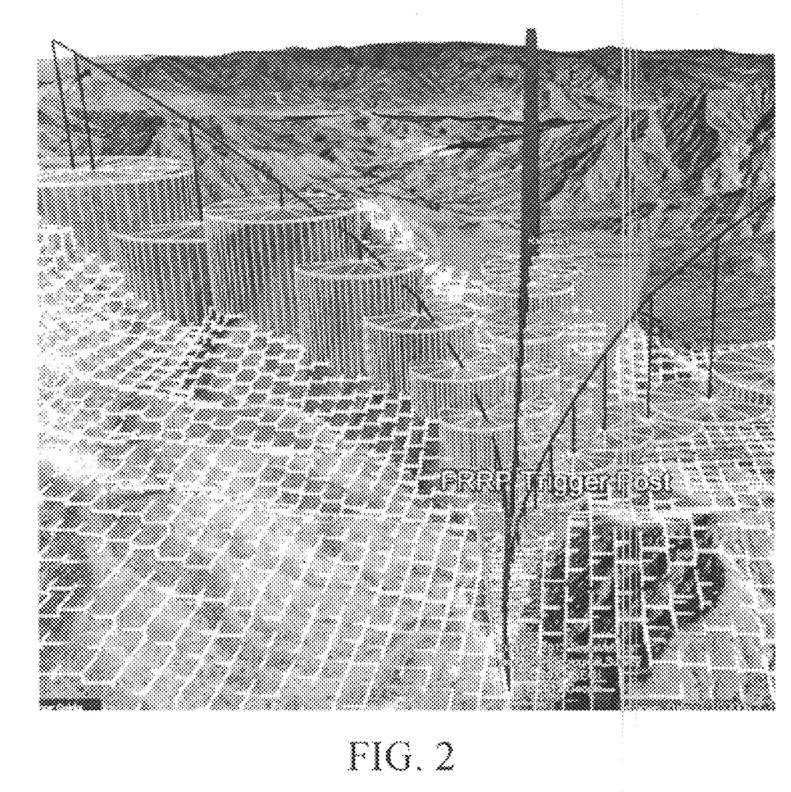
FIG. 2 is a perspective view of the pilot display with the actual and two alternate trajectories depicted.

FIG. 2 is a perspective view of the pilot display with three trajectories depicted, the actual predicted trajectory and left and right alternate trajectories (e.g. "avoidance trajectories").

2. Sense Terrain Module 30. Sense Terrain Module 30 utilizes an existing digital terrain map (DTM) product and an existing map manger routine to store and retrieve terrain elevations. Either standard rasterized or special formatted terrain data can be used. Standard rasterized data such as digital terrain elevation data (DTED) can be used. In addition, the GEDACS compressed digital terrain map (CDTM) (not shown) can be used in its native encoded state (non-decoded).

The Sense Terrain Module 30 employs a two-step process. The first step occurs pre-flight when the DTM which will be utilized for the iGCAS system must be loaded into the iGCAS controller 100 non-transitory memory. If the operator chooses to use a standard rasterized DTM product, the flight plan from flight controller 60 is interrogated and a portion of the DTM that, at minimum, encompasses both the start point and end point (e.g., the "navigation space or "gaming area") is selected and loaded into the iGCAS controller 100 non-transitory memory. If on the other hand, if a compressed DTM (CDTM) product is desired, a CDTM with map boundaries at minimum, encompassing the flight plan, and at maximum, a covering the entire globe, is loaded into the iGCAS controller 100 non-transitory memory. Secondly and while in-flight, a subset of the gaming area data surrounding the current aircraft position is retrieved and used to generate a "local map" in iGCAS controller 100 transitory memory during flight. iGCAS controller 100 periodically updates this local map as the aircraft flies, discarding data that lies a predetermined distance behind the aircraft and retrieving new data that lies a predetermined distance ahead of the aircraft. Sense Terrain Module 30 is supplied with real-time geo-referenced position data for the aircraft by the Sense Own State Module 10.

Figure 7:
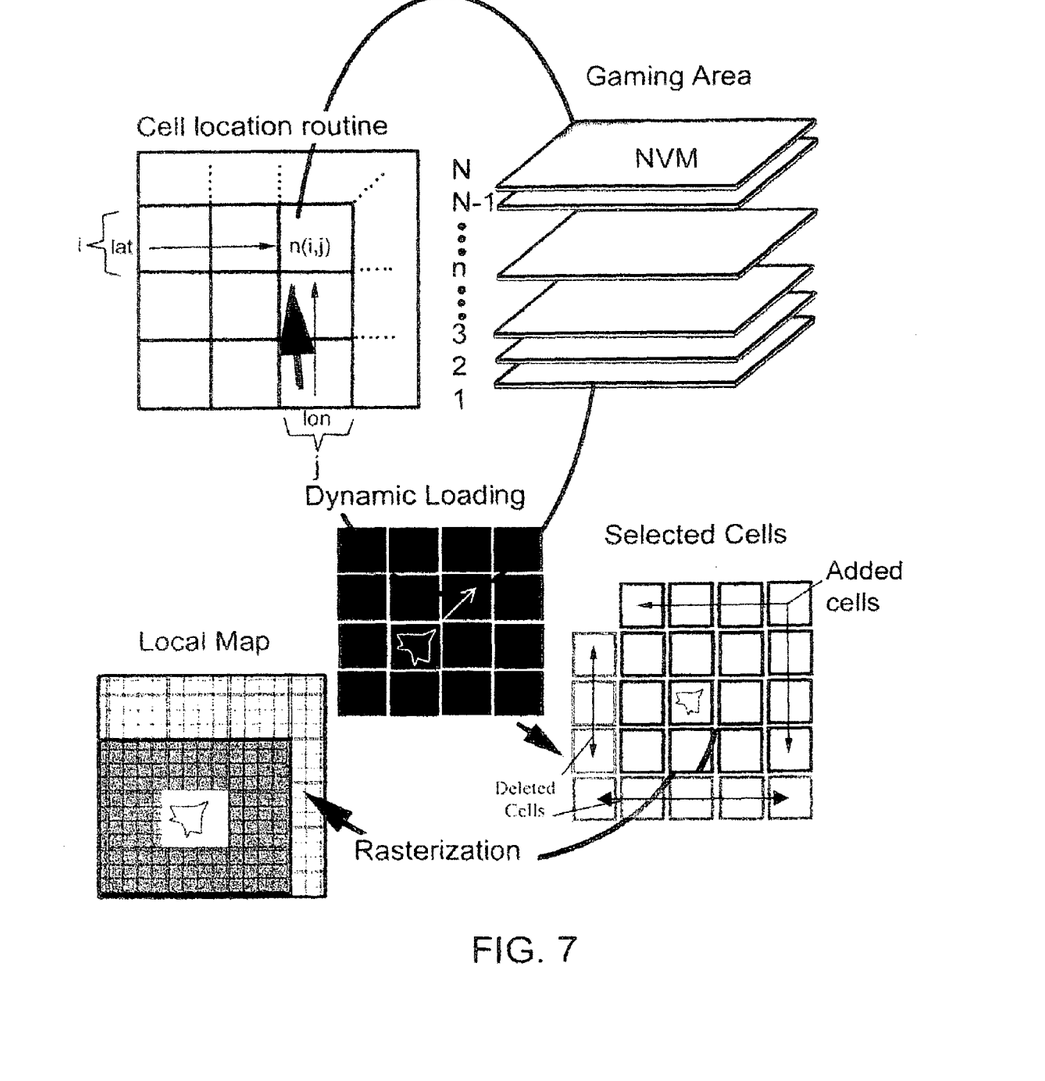
FIG. 7 is a flow diagram of the cell location routine for use by the Sense Terrain Module 30.

With reference to FIG. 7, this second step utilizes a 3 by 3 array of square terrain elevation ½ degree areas (known as cells) where the current aircraft geo-referenced position is located within the center cell. Cells are delineated based on predetermined units of latitude and longitude within the DTM. Management of the cells (adding and discarding) is driven by the geo-referenced position of the aircraft. As the aircraft moves out of the center cell, rows or columns of cells that are now two rows or columns (units of latitude or longitude) behind the aircraft are discarded and the row or column one ahead of the aircraft (latitude and longitude) is added. Cells are identified relative to the aircraft by projecting the aircraft's heading forward in a straight line and establishing this heading as a 45 degree diagonal relative to the cell currently occupied by the aircraft. The adjacent cells may then be delineated based on cell size in latitude and longitude as shown in FIG. 7. Cells are added and removed as the aircraft changes latitudinal and longitudinal positions such that two rows of cells, based on unit area, ahead of the aircraft and one row of cells behind the aircraft are populated into the "local map" in iGCAS controller 100.

Multiple local maps can be utilized each containing terrain data with different horizontal resolution to allow quicker execution of the scanning process. For example, three resolutions of local maps can be utilized: (1) GEDACS in native unencoded form with 1 arc-second resolution; (2) normal rasterized data at 3 arc-second resolution; and (3) a coarse rasterized dataset at 15 arc-second resolution. Use of these various local maps is explained in greater detail below with respect to the Predict Collision Threat Module 20.

3. Predict Collision Threat Module 20. The Predict Collision Threat module 20 functions to generate an elevation profile (e.g., scan pattern) corresponding to the terrain under each trajectory profile and avoidance trajectory profile generated by the cooperative functioning of the TPA of the Sense Own State Module 10 and the Predict Avoidance Trajectory Module 40, as described in further detail below.

The scan pattern is trajectory-based in that points along the trajectory are selected and the surrounding terrain elevations from the local map are scanned for the highest elevation. The amount of terrain scanned about a given trajectory point varies with estimated position uncertainty and aircraft wingspan (described below in further detail). A process termed Digital Terrain Inter-Post Interpolation is used, wherein a circular scan area is projected down onto a tilted GEDACS tile. The highest point of the tile within that circular scan area is assigned for the entire breadth of that area that was scanned (termed a scan-cylinder) (see FIG. 4). This process is repeated along the entire track of the trajectory to create a histogram of scan-cylinders depicting the terrain elevation with range from current aircraft position.

Thus, the act of scanning the local map is done in a manner that treats the local map elevations as 2-dimensional tiles (an elevation about the area of regard for that elevation value) rather than a post (an elevation only at that exact latitude and longitude). When GEDACS encoded data is used in its native encoded format, the highest point along or within the scan-cylinder is used to fill that scan-cylinder (see FIG. 4).

Figure 8:
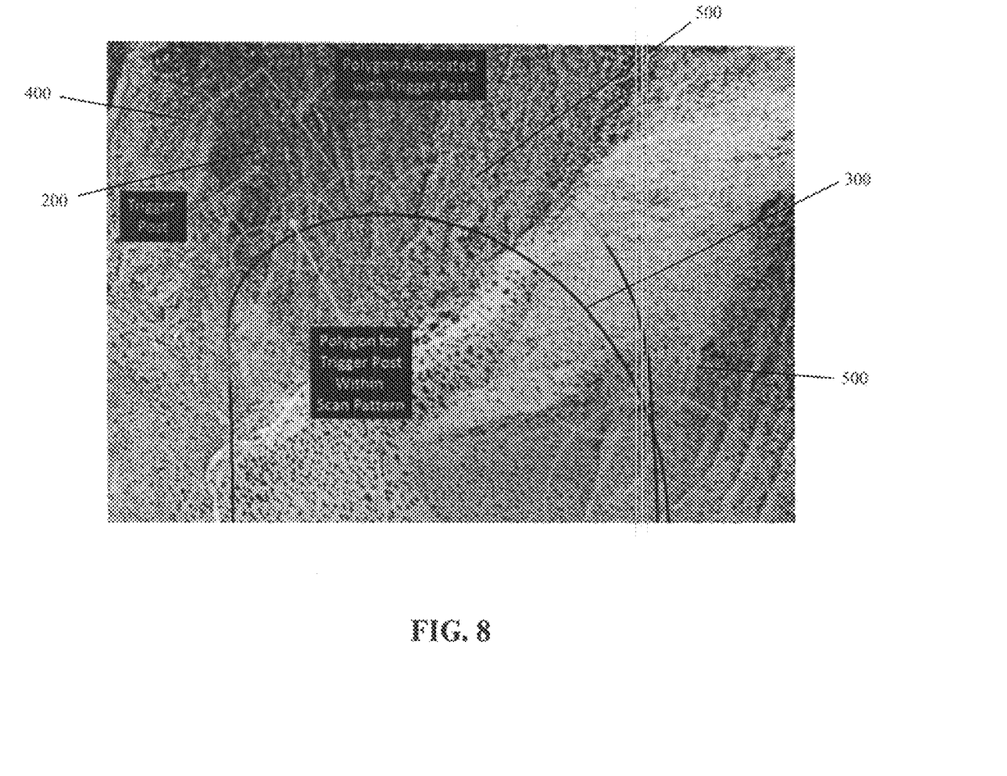
FIG. 8 is a perspective illustration depicting a flight trajectory with cylinder-scans and a terrain elevation.

Predict Collision Threat Module 20 employs a novel collision prediction algorithm that searches for the nearest elevation to fill a given bin. With reference to FIG. 8, indicia 200 represents the location of a terrain elevation within the local map in the area surrounding the predicted trajectory, 300. Tile 400 is the tile associated with the indicated terrain elevation 200. Scan cylinders are represented by reference character 500. In this case, tile 400 is the highest tile in the surrounding area and its elevation was used to fill the 3 scan-cylinders 500 that touch it.

Figure 4:
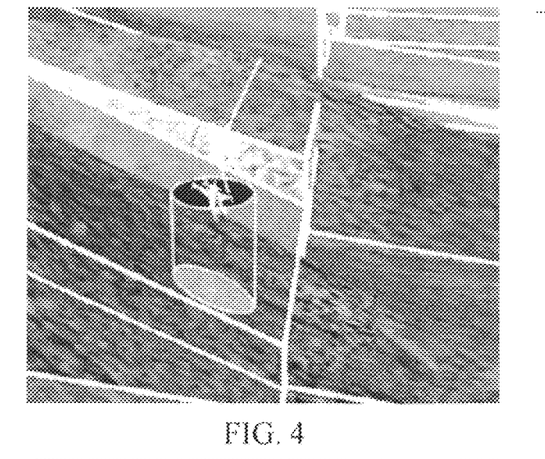
FIG. 4 is a perspective illustration of the cylindrical uncertainty association with an aircraft's trajectory for terrain scanning.

The range increments or "scan-cylinder width" is variable. The amount of area scanned in each of the scan-cylinders is a function of the aircraft's navigation uncertainty and the trajectory track uncertainty. Navigation uncertainty is the estimated radius of position error in the current navigation solution. The track uncertainty is an angular estimate of the trajectory prediction's track error. The root-sum-square of the navigation and track uncertainty are added to the vehicle's wingspan determine the radius about a given track position within which terrain will be scanned to fill a given scan-cylinder. FIG. 4 is a perspective illustration of the Cylindrical Uncertainty Association with an aircraft's trajectory for terrain scanning. Use of multiple local maps with various resolutions is determined by the radius of uncertainty for any given scan-cylinder. When the uncertainty radius is small, the finer resolution local map is used. As the radius grows larger, the coarser resolution maps are used. Use of variable resolution maps reduces the computational load of interrogating the local map.

Figure 3:
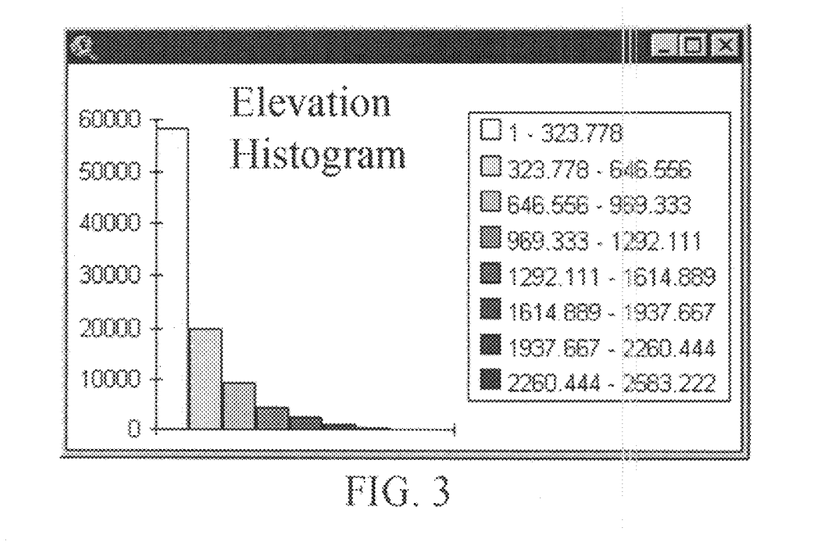
FIG. 3 is a graphical depiction of an elevation histogram.

The amount of overlap of one scan-cylinder to the next is adjustable within the algorithm. The higher elevation within any adjacent scan-cylinder overlap is used within the histogram. FIG. 2 is a perspective view of the pilot display depicting scan-cylinders along the tracks of three separate trajectories. FIG. 3 is a graphical depiction of an elevation histogram.

4. Predict Avoidance Trajectory Module 40. The Predict Avoidance Trajectory Module 40 simulates all avoidance maneuvers ahead of the aircraft (in the example shown in FIG. 2, three avoidance trajectories are shown). A kinematic model is used to compute the avoidance trajectory by determining the orientation of the lift force vector and thereby determining the resulting motion of the vehicles mass. This model predicts three time-history responses of the aircraft (roll axis, speed, and pitch axis). Each time history response (roll, pitch and speed axis) have a lag/delay phase, an onset phase and a steady state phase (to be described in further detail below).

Aircraft unique values are used to depict the dynamic response of the vehicle. Next, for each simulated avoidance maneuver the Predict Avoidance Trajectory Module 40 produces a geo-referenced 3-dimensional trajectory. A time-history array of predicted elevation, range and ground track position are derived. The ground track positions are used by the Predict Collision Threat Module 20 and the range and elevation data will be compared in the Determine Need to Avoid 50 module (to be described in further detail below) to the terrain histogram produced by the Predict Collision Threat Module 20.

Figure 5:
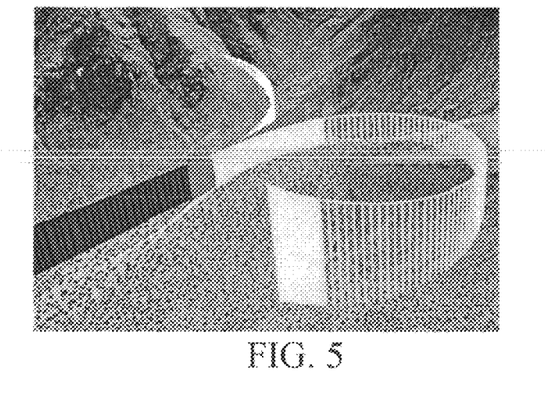
FIG. 5 is a perspective pilot display of a geo-referenced three-dimensional trajectory produced by the Predict Avoidance Trajectory Module 40.

FIG. 5 is a perspective pilot display of a geo-referenced 3-dimensional trajectory produced by the Predict Avoidance Trajectory Module 40. Trajectories must be projected far enough ahead of the aircraft current position to determine if the terrain can be cleared. They also must be continuously updated as the aircraft moves forward and changes position relative to the surrounding terrain. Consequently, this simulation must execute faster than real time. A kinematic flight model is used to determine the orientation and magnitude of the lift vector as well as air speed for each trajectory using inputs from the Sense Own State Module 10. As described above, the model has a delay phase, an onset phase and a steady state phase. The delay phase is initialized at conditions provided as inputs from the Sense Own State Module 10 and models computational and flight dynamic response delays. The delay phase consists of a computational and communications delay (signal processing, i.e. time for input values to be generated, passed to and used within the model, which may also be described as the frame time of the processor, and link delay in the case of UAVs with iGCAS implemented on the ground in the ground control station), a vehicle dynamic response delay (the amount of time that transpires between the time that the pilot moves the aircraft's controls and the time that the aircraft responds to said controls in terms of pitch, roll, speed, etc.) and, in cases where an autopilot is not being used to automatically recover the aircraft, pilot reaction time, which represents the predicted or estimated amount of time that it will take for the pilot to begin to respond to an avoidance warning. The delay phase assumes there will be no change in the orientation and magnitude of the lift vector and air speed throughout these three different types of delays. The accounted-for delays may be represented as constants (time of delay) as determined by the inventors on an experimental basis and/or may be customizable by the pilot based on training, type of aircraft, personal preference or the like, and input through, i.e., the preferences page of the application as described below. Alternatively, the delays may be derived through historic aircraft and/or pilot performance. The onset phase models the transition from the delay phase to the steady state climb phase. Three axes are computed in the kinematic model, roll, pitch and speed. Range and ground track are derived from these.

The time step for the trajectory simulations vary based on track uncertainty and the level of dynamic maneuvering at any point in the simulation. During the delay phase and onset phase, smaller time steps are used. During the steady state phase, larger time steps are used to reduce computational load. Time steps are represented by the vertical lines shown under the trajectories depicted therein.

Figure 6:
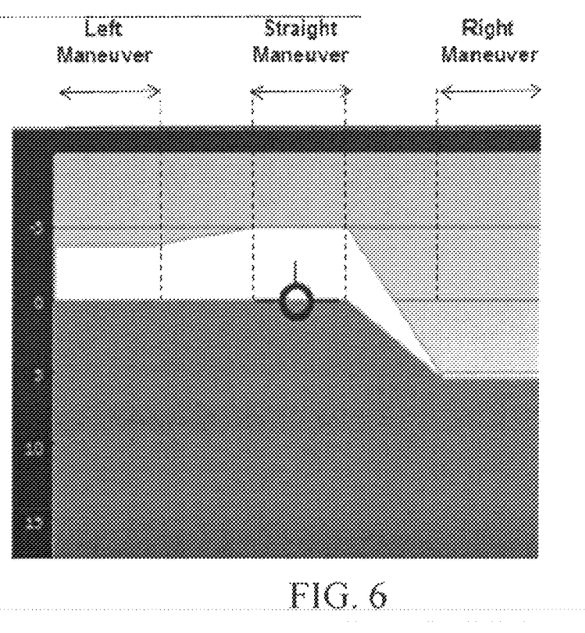
FIG. 6 is a screen shot of the results of the comparison of the simulated trajectory profile (FIG. 5) to the corresponding terrain elevation histogram (FIG. 3) as made by the Determine Need to Avoid Module 50.

5. Determine Need to Avoid Module 50. The Determine Need to Avoid Module 50 functions to determine: (1) which avoidance maneuver should be used; (2) when it should be initiated; and (3) when it should be terminated. Given a plurality of simulated avoidance maneuvers run by the Predict Avoidance Trajectory Module 40, the Determine Need to Avoid Module 50 selects the optimal avoidance maneuver to be used. The Determine Need to Avoid Module 50 accomplishes this by comparing each simulated trajectory profile (FIG. 5) to the corresponding terrain elevation histogram (FIG. 3) generated by the Predict Collision Threat Module 20. The results of this comparison are shown in FIG. 6. Clearly, a left or straight maneuver will cause problems, but a right maneuver will avoid a collision. The pilot is notified and or an avoidance command can be compiled and sent to flight controller 60 for automatic implementation. To limit unnecessary warnings, an avoidance command is issued only when the last viable maneuver becomes invalid. Once an avoidance command is issued that maneuver remains the selected avoidance maneuver to fly. Maneuver termination occurs when the straight recovery becomes a viable recovery.

To integrate a ground collision avoidance system with an air collision avoidance system (ACAS), a separate ground collision avoidance calculation is performed. To accomplish this, the ACAS sends its predicted escape trajectories to the ground collision avoidance system. Each ACAS trajectory is run through the iGCAS with end state of the ACAS trajectories used as the Sense Own State values. For each ACAS trajectory in which the iGCAS determines that an avoidance is needed, the ACAS trajectory is flagged as invalid and sent back to the ACAS. The ACAS will then not consider these as viable maneuvers in its assessment of how to avoid potential midair collisions.

Figure 9:
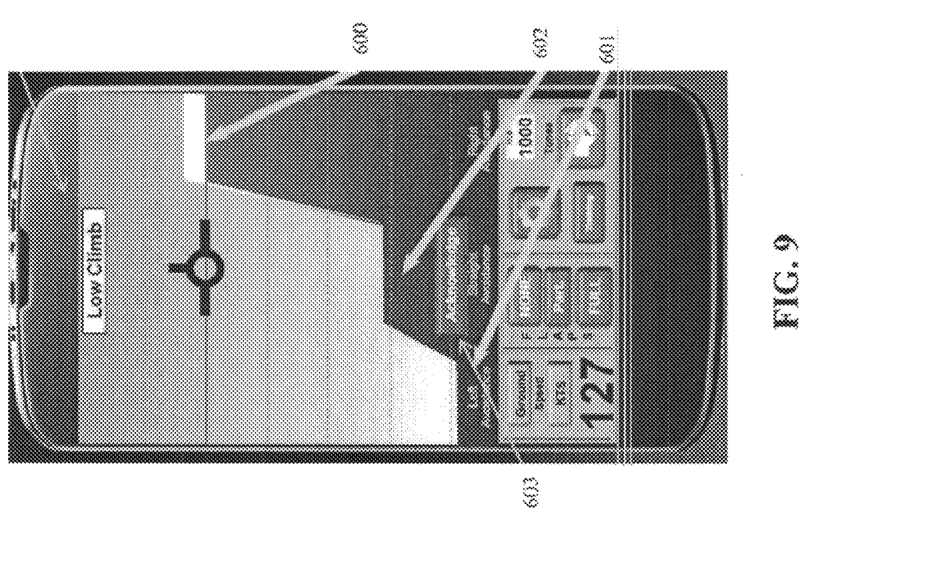
FIG. 9 is a screen shot of the Viable Maneuver Display according to the present invention.
Figure 10:
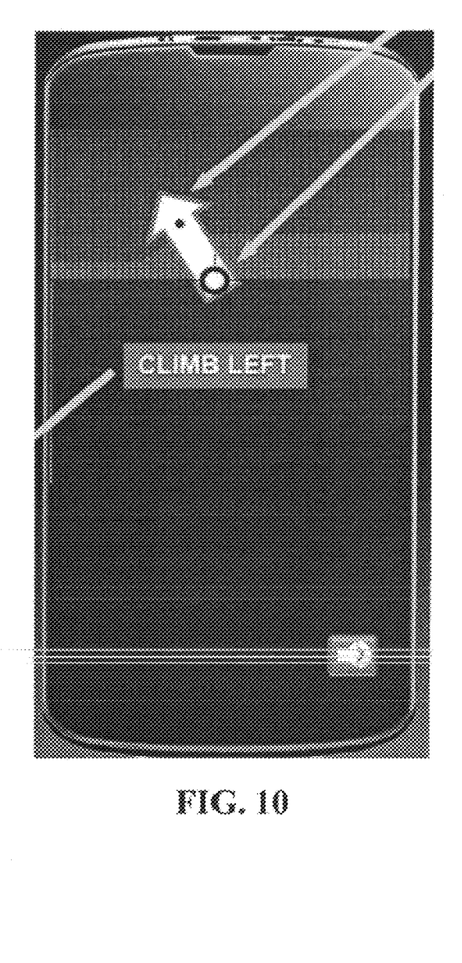
FIG. 10 is a screen shot of the Avoidance Director Display according to the present invention.

6. Notify Module 70. The Notify Module 70 displays each maneuver's viability to the pilot by a colored GUI. In the display window avoidance direction arrows in combination with other graphics show time-to-recovery or terrain clearance to indicate the viability of each trajectory. FIGS. 9 and 10 are screen shots of the Viable Maneuver Display and Avoidance Director Display screens, respectively, as reduced to practice on a conventional smart phone application. Time-to-recovery or terrain proximity of each trajectory drives a modified horizon line relative to a vehicle indicator to indicate the viability of each trajectory.

The Viable Maneuver Display appears and sounds a tone when any maneuver puts the aircraft in a position that is less than 15 seconds away from terrain impact and alerts the pilot with greater urgency that certain maneuvers will or may not clear terrain. It indicates time-to-avoid for avoidance maneuvers, and as terrain approaches time-to-avoid values decrease and are indicated by a rising scale on the display in the vicinity of the approaching terrain. In FIG. 9, the approaching terrain is on the right side of the aircraft, as indicated by reference character 600. Reference characters 601 and 602 indicate relative times-to-avoid of the terrain on the left and in front of the aircraft, respectively. Negative time-to-avoid values are displayed as those portions of the graph that rise above the level of the aircraft symbol, and are depicted in a lighter shade as shown in FIG. 9. The pilot may select the "Acknowledge" button 603 on the Viable Maneuver Display to return the display to its default navigation mode. The display also reverts to the navigation mode when all time-to-avoid values are greater than 30 seconds. The Avoidance Director Display Screen (FIG. 10) is triggered and an additional tone is sounded when all times to avoid are less than zero seconds.

Furthermore, more complex avoidance options are available through a combination of the trajectory predictions and the local terrain. Geo-referenced climb performance as predicted in the trajectories is compared to the local map on a tile by tile basis to generate a clearable terrain map. The clearable terrain map is presented to the pilot in a top-down aircraft or geo-referenced format similar to other mapping displays. Terrain that is 200 feet higher/wider than the maximum clearance height is colored solid red, terrain that can only be cleared by −200 to 200 feet is colored with shades of orange ranging from the red of the "can't be cleared" terrain to solid yellow at 200 feet of clearance. Between 200 and 500 feet, terrain is colored yellow with varying transparency (no transparency at 200 feet of clearance to fully transparent at 500 feet).

The clearable terrain map can also be used to determine the maneuvering required to clear terrain. The sequence of turns and climbs, their direction and duration is derived through the Predict Trajectory module's turn and climb performance.

7. Pilot Controls Module 80. The Pilot Controls module 80 allows turning the system on and off as well as the entry of a terrain clearance buffer (TCB), and other mode states:
  IDLE: This is the first state the system enters on program initialization.
  STANDBY: This is a mode state that allows the system to run in real-time, however not execute the Avoid function. In this state, integrity checks are made. If not passed, the system will either stay in the STANDBY state or be transitioned to the FAIL state. If all integrity checks are passed, the system transitions to the ON state.

ON: In this state the system executes all collision avoidance functions issuing warnings and automatically initiates avoidance maneuvers.

LANDING: Inhibition of warnings on runway landing approach if minimum decent rate threshold not violated.

FAIL (of system integrity check).

8. Avoid Module 90. The Avoid module 90 defines how an aircraft will perform avoidance maneuvers through 3-dimensional space.

The above-described iGCAS system may be used standalone as a warning system or, when coupled to an appropriate autopilot, becomes an automatic recovery system. Coupling with existing autopilot for Auto-Collision Avoidance uses the iGCAS to engage conventional autopilots to execute the avoidance maneuver. The iGCAS system can initiate altitude capture or climb rate capture autopilots for vertical maneuvering and heading capture, turn rate capture or waypoint navigation for turning maneuvering. The coupler will determine appropriate autopilot values to set as capture values as determined by the maneuver selected by the iGCAS algorithm.

The trajectory model's rates are converted into appropriate autopilot commands in the Coupler module. The Coupler module communicates avoidance commands to the autopilot by automatically setting an autopilot to various capture values. For example, if the autopilot iGCAS is interfaced with has a climb rate capture and bank capture mode, appropriate values are automatically set in the autopilot by the coupler. If an auto-throttle is available, max throttle is selected.

It may also be integrated with a conventional Air Collision Avoidance System to eliminate invalid ACAS avoidance trajectories based on ground collision risk, as described above with reference to the Determine Need to Avoid Module 50.

Figure 11:
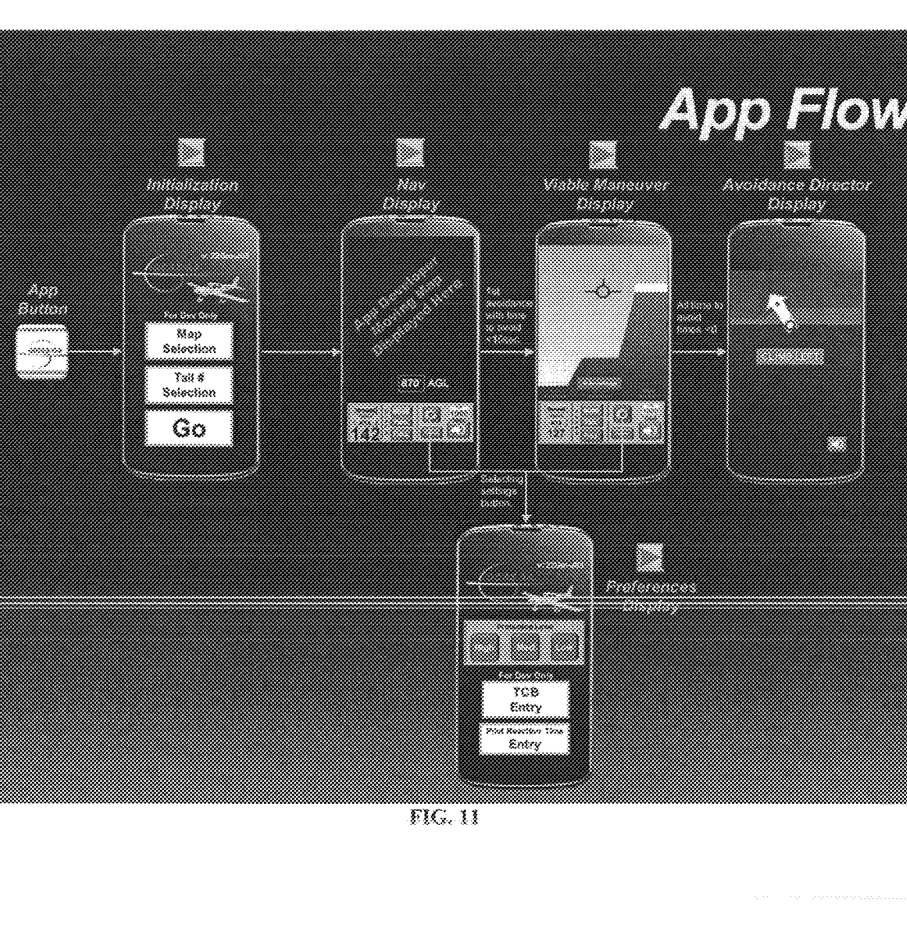
FIG. 11 is a flow diagram of the smart phone application interface according to the present invention.

A flow diagram of the smart phone application interface is shown in FIG. 11. The iGCAS has been reduced to practice on a conventional smart phone and adapted to and integrated into both a small unmanned aircraft as well as a Cirrus SR22. However, the iGCAS can be adapted to the performance of other vehicles by altering various vehicle model constants contained in the system's configuration file. Starting the iGCAS program, a pilot is allowed to select a map over which to fly and/or to input his aircraft's tail number from which the application may gather the vehicle's performance parameters (mentioned above) to be utilized by the modules described herein. The default navigation screen may show a moving map of the terrain in the area under the aircraft's position. A wireless data feed of input parameters from avionics units was sent to a personal device running the GCAS modules. Limited flight evaluations were conducted on both aircraft indicating promising advancements in CFIT protection, resistance to false warnings when operating in and around rough terrain and potential affordability. The system also provides the following advantages. One skilled in the art should understand that the above-described system is an improvement over conventional TAWS systems because it positively directs the pilot as to what to do, rather than leaving it to him to figure out. The value of this information avoids the nuisance effect of prior art systems, which undermines pilot responsiveness to warnings and often causes them to shut the system off. As a result the system will be more effective at preventing controlled flight into terrain.

It should now be apparent that the above-described system and method offers a robust model dependent technique to calculate both wing deflection and slope over the entire surface of a 3D structure, as opposed to at finite points thereon as in the prior art. Each of the proposed improvements can be implemented in an existing TAWS system without the need for any or all of the other proposed improvements. The availability of wing deflection and slope data, and the corresponding internal and external load values, at all element grid points across the structure allows more accurate, real-time structural health monitoring, active flexible motion control, drag reduction, sonic boom reduction, increased safety, and other advantages.

It should be understood that various changes may be made in the form, details, arrangement and selection of the components. Such changes do not depart from the scope of the invention which comprises the matter shown and described herein and set forth in the appended claims.

The invention claimed is:

1. A computerized ground collision avoidance system (iGCAS) comprising a computer processor including a transitory computer-readable storage device and a non-transitory computer-readable storage device storing a plurality of software modules including:
   a sense own state module configured to gather data to compute trajectory;
   a sense terrain module including a digital terrain map (DTM) and map manger routine to store and retrieve terrain elevations;
   a predict avoidance trajectory module configured to simulate avoidance maneuvers ahead of a flight path by computing one or more avoidance trajectories;
   a predict collision threat module configured to generate one or more elevation profiles, each one of said one or more elevation profiles corresponding to terrain under each of said one or more avoidance trajectories computed by said predict avoidance trajectory module;
   a determine need to avoid module configured to determine which of said one or more avoidance trajectories should be used, when it should be initiated, and when it should be terminated by comparing said one or more avoidance trajectories and said corresponding one of said one or more elevation profiles from said predict avoidance trajectory and predict collision threat modules;
   a notify module configured to display the viability of each one of said one or more avoidance trajectories to the pilot and, when needed, to direct the pilot through the avoidance trajectory by a colored GUI;
   a pilot controls module configured to turn the system on and off as well as configure the system personal protection and warning needs;
   an avoid module configured to define how an aircraft will perform avoidance trajectories through 3-dimensional space.

2. The computerized ground collision avoidance system of claim 1, wherein said collision avoidance system further comprises a common interface configured to enable said sense own state module, said sense terrain module, said predict avoidance trajectory module, said predict collision threat module, said determine need to avoid module, said notify module, said pilot control module and said avoid module to exchange data with other ones of said modules and with an existing flight controller.

3. The computerized ground collision avoidance system of claim 2, wherein said sense own state module is configured to regularly interrogate said flight controller using said common interface and to collect flight parameters from said flight controller.

4. The computerized ground collision avoidance system of claim 2, wherein said sense own state module is configured to calculate flight parameters based on data received from said flight controller.

5. The computerized ground collision avoidance system of claim 1, wherein said sense terrain module is configured to utilize standard rasterized data.

6. The computerized ground collision avoidance system of claim 1, wherein said sense terrain module is configured to utilize special formatted terrain data.

7. The computerized ground collision avoidance system of claim 1, wherein said sense terrain module is configured to interrogate said sense own state module via said common interface, and wherein said sense terrain module is further configured to utilize said digital terrain map to generate a real-time local map having an array of cells, and to add and discard one or more of said cells in said array of cells to reflect the real-time position of a vehicle.

8. The computerized ground collision avoidance system of claim 7, wherein said sense terrain module is configured to generate a plurality of real-time local maps, wherein each of said plurality of real-time local maps has a different resolution.

9. The computerized ground collision avoidance system of claim 1, wherein for each of said avoidance trajectories, said predict avoidance trajectory module is configured to utilize a kinematic model to predict a roll-axis time-history response, a speed time-history response, and a pitch axis time-history response of said vehicle, wherein each of said roll-axis, speed and pitch axis time-history responses further comprise a lag/delay phase, an onset phase, and a steady state phase.

10. The computerized ground collision avoidance system of claim 1, wherein said delay phase accounts for one or more of a computational delay, a communications delay, a vehicle dynamic response delay, and a pilot reaction time delay.

11. The computerized ground collision avoidance system of claim 10, wherein said predict avoidance trajectory module is further configured to calculate a range and ground track of said vehicle for each of said avoidance trajectories.

12. The computerized ground collision avoidance system of claim 1, wherein said predict collision threat module is configured to receive said one or more avoidance trajectories calculated by said predict avoidance trajectory module, and wherein said predict collision threat module is further configured to use a digital terrain inter-post interpolation model to calculate a terrain elevation histogram corresponding to each of said one or more avoidance trajectories.

13. The computerized ground collision avoidance system of claim 12, wherein each of said terrain elevation histograms accounts for estimate position uncertainty and wingspan of said vehicle.

14. The computerized ground collision avoidance system of claim 1, wherein said determine need to avoid module is configured to determine when all of said one or more avoidance trajectories becomes invalid, and to thereafter transmit warning signals via said common interface to said flight controller.

15. The computerized ground collision avoidance system of claim 1, wherein said determine need to avoid module is configured to determine when all of said one or more avoidance trajectories becomes invalid, and to thereafter transmit warning signals via said common interface to said notify module.

16. The computerized ground collision avoidance system of claim 1, wherein said notify module comprises a viable maneuver display screen and an avoidance director display screen.

17. The computerized ground collision avoidance system of claim 1, wherein said avoidance system is configured to operate on a smartphone device.

18. A method of avoiding aircraft ground collision, comprising the steps of:
gathering data to compute flight trajectory;
storing and retrieving terrain elevations from a digital terrain map (DTM) using a map manager routine;
simulating avoidance maneuvers ahead of an aircraft by computing one or more avoidance trajectories;
generating one or more elevation profiles corresponding to terrain under each of said one or more avoidance trajectories;
comparing said one or more avoidance trajectories with said corresponding one of said one or more elevation profiles to determine which of said one or more avoidance trajectories should be used, when it should be initiated, and when it should be terminated;
displaying the viability of each one of said one or more avoidance trajectories to a pilot of said aircraft; and
determining how well said aircraft will perform each one of said one or more avoidance maneuvers in three-dimensional space.

* * * * *